United States Patent
Robillard et al.

(10) Patent No.: US 6,675,600 B1
(45) Date of Patent: Jan. 13, 2004

(54) THERMAL MISMATCH COMPENSATION TECHNIQUE FOR INTEGRATED CIRCUIT ASSEMBLIES

(75) Inventors: Gene A. Robillard, Stoneham, MA (US); Richard S. Holland, Framingham, MA (US); Robert N. Graney, Northboro, MA (US); John W. Marciniec, Framingham, MA (US); John D. Mullarkey, Salem, MA (US); Paul H. Rourke, Pelham, NH (US)

(73) Assignee: BAE Systems Information and Electronic Systems Integration Inc., Nashua, NH (US)

( * ) Notice: Subject to any disclaimer, the term of this patent is extended or adjusted under 35 U.S.C. 154(b) by 0 days.

(21) Appl. No.: 10/310,230

(22) Filed: Dec. 5, 2002

(51) Int. Cl.[7] ............... F25D 23/12; H01L 21/00; G01J 5/02; F28F 7/00
(52) U.S. Cl. ............... 62/259.2; 438/73; 250/339.03; 250/352; 165/81
(58) Field of Search ............... 62/259.2, 6; 438/77; 250/339.03, 339.02, 332, 352; 165/81, 82

(56) References Cited

U.S. PATENT DOCUMENTS

| | | | |
|---|---|---|---|
| 3,992,774 A | 11/1976 | Burrer et al. | |
| 4,005,288 A | 1/1977 | Robillard | |
| 4,016,590 A | 4/1977 | Baur et al. | |
| 4,089,991 A | 5/1978 | Robillard | |
| 4,104,789 A | 8/1978 | Robillard | |
| 4,206,354 A | 6/1980 | Small, Jr. | |
| 4,943,491 A | 7/1990 | Norton et al. | |
| 4,998,688 A | * | 3/1991 | Longerich et al. ......... 244/3.16 |
| 5,092,036 A | * | 3/1992 | Hu et al. ............... 29/854 |
| 5,264,699 A | | 11/1993 | Barton et al. |
| 5,272,105 A | * | 12/1993 | Yacobi et al. ............ 438/412 |
| 5,291,019 A | | 3/1994 | Powell et al. |
| 5,308,980 A | | 5/1994 | Barton |
| 5,340,984 A | * | 8/1994 | Evans ............... 250/332 |
| 5,438,200 A | | 8/1995 | Thornton |
| 5,518,674 A | | 5/1996 | Powell et al. |
| 5,585,624 A | | 12/1996 | Asatourian et al. |
| 5,600,140 A | * | 2/1997 | Asatourian ............. 250/332 |
| 5,610,389 A | | 3/1997 | Asatourian |
| 5,705,041 A | * | 1/1998 | Belcher et al. ........... 204/192.1 |
| 5,714,760 A | | 2/1998 | Asatourian |
| 5,757,000 A | | 5/1998 | Rogowski et al. |
| 5,763,885 A | | 6/1998 | Murphy et al. |

(List continued on next page.)

FOREIGN PATENT DOCUMENTS

EP  0 817 273 A2  1/1998

OTHER PUBLICATIONS

PCT International Search Report dated Aug. 29, 2003 of International Application No. PCT/US02/38906 filed Dec. 5, 2002.

Sierra Pacific Infrared, Http: x26.com/infrared/images/fpa.htm, pp1–9.

(List continued on next page.)

*Primary Examiner*—William C. Doerrler
(74) *Attorney, Agent, or Firm*—Maine & Asmus

(57) ABSTRACT

Techniques for minimizing stress induced by temperature changes in an integrated circuit (e.g., focal plane array or processor) or other such assemblies that include materials having mismatched coefficients of thermal expansion/contraction are disclosed. A thermal interface including a flexible comb-like pattern enables compensation for mismatched coefficients thereby reducing thermal-related stress.

20 Claims, 4 Drawing Sheets

U.S. PATENT DOCUMENTS

| | | |
|---|---|---|
| 5,769,986 A | 6/1998 | Hagedorn et al. |
| 5,834,778 A | 11/1998 | Veyrier et al. |
| 5,846,850 A | 12/1998 | Dreiske et al. |
| 5,847,390 A | 12/1998 | Long et al. |
| 5,959,340 A | 9/1999 | Wan et al. |
| 5,966,945 A * | 10/1999 | Mengel et al. ............... 62/51.1 |
| 6,070,414 A | 6/2000 | Ross et al. |
| 6,103,540 A | 8/2000 | Russell et al. |
| 6,122,919 A | 9/2000 | Patel et al. |
| 6,160,310 A | 12/2000 | Powell et al. |
| 6,247,369 B1 | 6/2001 | Chapman et al. |
| 6,249,001 B1 | 6/2001 | Sauer et al. |
| 6,315,850 B1 | 11/2001 | Hagedorn et al. |
| 6,417,514 B1 | 7/2002 | Eniem et al. |
| 6,428,713 B1 | 8/2002 | Christenson et al. |
| 6,439,622 B1 | 8/2002 | Iwatsuki et al. |

OTHER PUBLICATIONS

Coldren et al., VCSEL Array Packaging for Free Space Interconnects, Report 1996–97 for Micro Project 96–050, Santa Barbara Research Center, pp. 1–5.

Coldren et al., High–Speed Modulation of Low Temperature Optimized Vertical–Cavity Lasers Over 77–300 K Temperature Range, Report 1997–98 for Micro Project 97–034, Santa Barbara Research Center, pp. 1–4.

Http:ir.sas.ac.jp/ASTRO–F/detail/irc2/node3.html Mechanical Design, May 22, 2001.

Http:ir.sas.ac.jp/ASTRO–F/detail/irc2/node4.html Focal Plane Arrays, May 22, 2001.

Case, William Explanation of the Coefficient of Thermal Expanasion to use in Nastran, http:analyst.gsfc.nasa.gov/FEMCI/cte/, Apr. 14, 1994, pp. 1–4.

* cited by examiner

THERMAL MISMATCH COMPENSATION TECHNIQUE FOR INTEGRATED CIRCUIT ASSEMBLIES

GOVERNMENT INTEREST

The U.S. Government may have certain rights in this invention pursuant to contract number DASG-60-00-C-0072, awarded by the United States Army.

FIELD OF THE INVENTION

This invention most generally relates to operatively coupling materials having mismatched coefficients of thermal expansion, and more particularly, to minimizing stress induced by temperature changes in an integrated circuit or other such assemblies.

BACKGROUND OF THE INVENTION

Focal plane arrays (FPA) are infrared detection systems that generally include an infrared detector array mounted on an integrated circuit. The detector array includes a number of photodetectors that have a sensitivity to the target range of infrared wavelengths to be monitored. The integrated circuit includes circuitry for receiving and processing signals detected by the detector array. Conventional interconnects or "bump-bonding" techniques are typically used to electrically and mechanically connect the detector array to the integrated circuit. Indium bumps are often used.

To ensure optimal detection performance, FPA assemblies are operated at cryogenic temperatures. To achieve such a performance environment, an FPA is typically mounted in a Dewar-type flask. A Dewar flask includes an inner flask and an outer flask separated from one another by a vacuum to prevent thermal transfer. The inner flask is cryogenically cooled. The FPA assembly is mounted in thermal contact with a surface of the inner flask thereby allowing the detector to operate at cryogenic temperatures.

A general problem with FPA technology involves differences in the coefficient of thermal expansion between the integrated circuit of the detector array and the surface of the inner flask. In particular, considerable stress is brought to bear on the assembly due to thermal mismatch between these layers. As the FPA is cycled between cold and ambient temperatures, the thermal mismatch related stress manifests on the connection points and circuitry thereby causing reliability issues, such as degraded performance, malfunction, and physical damage. Moreover, the larger the FPA assembly, the greater the degree of thermal-related stress that manifests.

Ideally, the coefficient of thermal expansion of the involved layers or surfaces should match so that they react to the temperature fluctuations similarly, minimizing the distortion of one material relative to another. However, other FPA properties required for proper function may dictate the use of materials having mismatched coefficients of thermal expansion.

A technique for minimizing the negative effects of mismatched coefficients of thermal expansion includes depositing thin layers of materials having spaced coefficients of thermal expansion so as to gradually transition from one coefficient of the desired materials to the other. However, this multilayer process increases manufacturing complexity, and is typically associated with a high failure rate.

In addition, many stacked layers may be required to ensure that the top layer remains flat and stress free. This stacking of layers increases the thermal mass of the assembly, as well as possible unevenness of the layers. Increased thermal mass increases temperature transition time, while uneven layers can cause uneven contractions during temperature transition. Uneven contractions contribute to undesired stress. Moreover, some of the layers cannot be made thin further contributing to unevenness.

What is needed, therefore, are techniques for compensating for mismatched coefficients of thermal expansion, while minimizing the thermal mass of the assembly.

BRIEF SUMMARY OF THE INVENTION

One embodiment of the present invention provides a focal plane array assembly. The assembly includes a thermal interface board having first and second surfaces, wherein a flexible comb-like pattern adapted to compensate for a mismatch in coefficients of thermal expansion is formed in at least one of the first and second surfaces. A cryogenic cold finger having a metal surface that is operatively coupled to the first surface of the thermal interface board. The metal surface is associated with a first coefficient of thermal expansion. A signal processing board associated with a second coefficient of thermal expansion has one of its surfaces operatively coupled to the second surface of the thermal interface board. In one such embodiment, the thermal interface board is a single wafer (e.g., Silicon), and the flexible comb-like pattern includes a number of one dimensional or multi-dimensional (e.g., X and Y) cuts in a surface of the wafer. Alternatively, the thermal interface board includes a platform, and the flexible comb-like pattern includes a number of flexible bumps (e.g., Indium) on a surface of the platform.

Another embodiment of the present invention provides a method of manufacturing an integrated circuit assembly, such as a focal plane array or processor assembly. The method includes forming a flexible comb-like pattern adapted to compensate for a mismatch in coefficients of thermal expansion in at least one of first and second surfaces of a thermal interface board. The method further includes bonding the first surface of the thermal interface board to a surface of a temperature changing interface (e.g., cryogenic cold finger) associated with a first coefficient of thermal expansion. The method further includes bonding the second surface of the thermal interface board to a signal processing board (e.g., multiplexer of a detector array or a microprocessor) associated with a second coefficient of thermal expansion. Note that the bonding steps can be performed in any order. In one such embodiment, the thermal interface board is a single wafer (e.g., Silicon), and forming the flexible comb-like pattern includes providing a number of one dimensional or multi-dimensional (e.g., X and Y) cuts in a surface of the wafer thereby defining the flexible comb-like pattern in the surface of the thermal interface board. Alternatively, the thermal interface board includes a platform, and forming the flexible comb-like pattern includes providing a number of bumps (e.g., Indium) on a surface of the platform thereby defining the flexible comb-like pattern in the surface of the thermal interface board.

Another embodiment of the present invention provides an integrated circuit assembly. The assembly includes a thermal interface board having first and second surfaces, wherein a flexible comb-like pattern adapted to compensate for a mismatch in coefficients of thermal expansion/contraction is formed in at least one of the first and second surfaces. A temperature changing interface (e.g., Dewar flask type) associated with a first coefficient of thermal expansion/ contraction is operatively coupled to the first surface of the thermal interface board. A signal processing board (e.g., multiplexer of a detector array or a microprocessor) associated with a second coefficient of thermal expansion/contraction is operatively coupled to the second surface of the thermal interface board. In one such embodiment, the thermal interface board is a single wafer (e.g., Silicon), and the flexible comb-like pattern includes a number of one dimensional or multi-dimensional (e.g., X and Y) cuts in a surface of the wafer. Alternatively, the thermal interface board includes a platform, and the flexible comb-like pattern includes a number of bumps (e.g., Indium) on a surface of the platform.

Note that the "coefficient of thermal expansion" as used herein is intended to represent the coefficient of thermal contraction as well. Generally stated, stress related to thermal expansions and/or contractions can be compensated for by employing embodiments of the present invention.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION OF THE INVENTION

Figure 1:
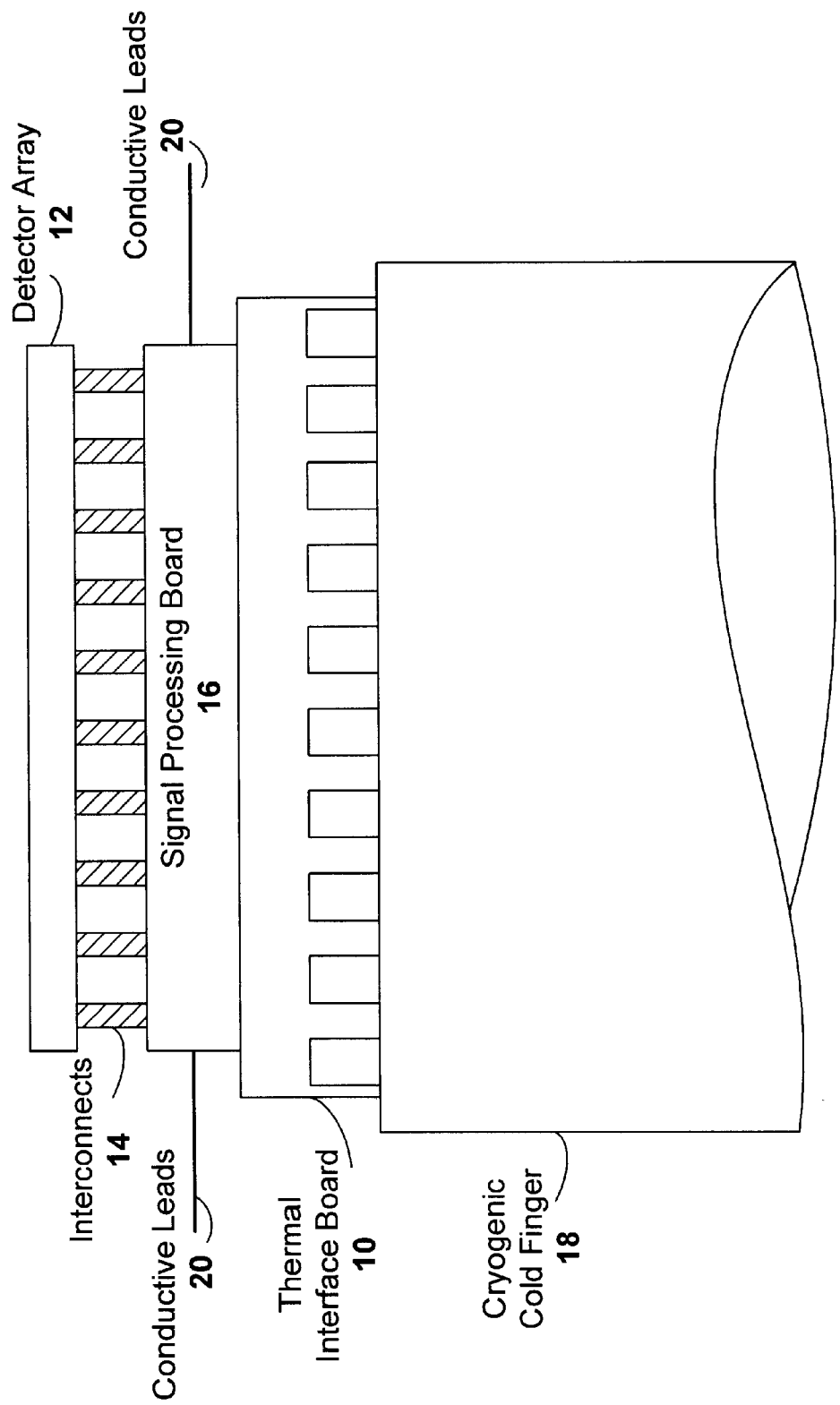
FIG. 1 is a side view diagram illustrating a focal plane array assembly configured in accordance with one embodiment of the present invention.

FIG. 1 is a side view diagram illustrating a focal plane array (FPA) assembly configured in accordance with one embodiment of the present invention. The assembly includes a detector array 12, a signal processing board 16, interconnects 14, conductive leads 20, thermal interface board 10, and a cryogenic cold finger 18.

An infrared focal plane array (FPA) assembly typically includes thousands to hundreds of thousands of photodetectors in a space smaller than one square inch. The photodetectors of the array 12 are each electrically coupled to the signal processing board 16, which receives detected data and provides it to a processing unit via conductive leads 20. The processing unit may be local or remote to the signal processing board 16 depending on the application, and whether or not it is necessary to subject the processing unit to cryogenic temperatures.

In one embodiment, the signal processing board 16 is a multiplexer formed on a Silicon substrate. The conductive leads 20 can be implemented, for example, with ribbon cable or other connective mechanisms suited for cryogenic temperatures. The interconnects 14 can be solder bumps, such as Indium bumps, thereby electrically and mechanically connecting the array 12 to the signal processing board 16. The underside of the signal processing board 16 can be bonded (e.g., rubber cement or epoxy) to the thermal interface board 10, and the thermal interface board is bonded (e.g., rubber cement or epoxy) to the cold finger 18.

Note that the type of bonding materials used to bond the signal processing board 16 and thermal interface board 10 in place depends on factors such as the desired thermal transfer through the assembly, and the operating temperature. Further note that the FPA assembly can be manufactured in stages. For instance, the thermal interface board 10 can be bonded to the cold finger 18 to form a first sub-assembly, while the detector array 12 can be electrically and mechanically connected to the signal processing board 16 via interconnects 14 to form a second sub-assembly. The first and second sub-assemblies can then be bonded together to form the overall assembly. The sub-assemblies can be tested for proper operation prior to forming the overall assembly.

The cold finger 18 may be, for instance, the inner flask of a Dewar flask or other temperature changing interface adapted for achieving non-ambient temperatures. In one particular embodiment, the thermal interface board 10 could be mounted on the surface of the inner flask in the evacuated chamber of a Dewar flask. This surface of the flask can be, for example, an Iron-Nickel-Cobalt compound or some other metal having a desired coefficient of thermal expansion. The flask material has to embody other characteristics such as workability, zero gas permeability, and desired thermal conductance. Conductive leads 20 can be configured to run down the side of the inner flask to a conductor that electrically couples the signal processing board 16 to the environment outside the Dewar flask where the detected signals can be used for the desired application.

Note that techniques other than the Dewar-type can be employed here to bring the assembly to cryogenic temperatures, and the present invention is not intended to be limited by any one particular means for achieving cryogenic temperatures. Likewise, the actual implementation details of the detector array 12, the signal processing board 16, the conductive leads 20, and the interconnects 14 may vary from one embodiment to the next, and such variables are not intended as limitations on the present invention. Rather, the principles of the present invention can be employed in many applications where it is necessary to operatively couple materials having mismatched coefficients of thermal expansion thereby reducing temperature change related-stress.

For purposes of discussion, assume that signal processing board 16 is composed on a Silicon substrate. Further assume that the cold finger 18 is an inner flask of a Dewar-type device, where the inner flask surface is composed of Molybdenum. Although Molybdenum has a low coefficient of thermal expansion, it is not as low as that of the Silicon substrate of signal processing board 16. As such, the thermal interface board 10 is used to compensate for the mismatch of thermal coefficients between the signal processing board 16 and the cold finger 18.

In one embodiment, the thermal interface board 10 is made from material having a coefficient of thermal expansion that closely matches that of the signal processing board 16. For example, both the thermal interface board 10 and the signal processing board 16 could be implemented with Silicon. In the embodiment illustrated, the thermal interface board 10 has a two-dimensional grid (X, Y) pattern cut into its underside thereby defining a Silicon "comb-like" or "columned" structure.

The dimensions of the X and Y direction cuts are such that the remaining columns of Silicon can sufficiently flex to compensate for the differing rates of thermal expansion associated with the signal processing board 16 and the cold finger 18. In addition, the resulting pattern should provide the necessary structural integrity to the assembly.

The cuts of the pattern can have, for example, the following dimensions: a width of about $1/100^{th}$ to $1/10000^{th}$ of an inch, and a depth of about 10 to 90 percent of the thickness of the thermal interface board 10. The cuts in a given direction can be spaced about $1/100^{th}$ to $1/100^{th}$ of an inch from each other. In one such embodiment, the thermal interface board 10 is a 0.25 square inch Silicon wafer having a thickness of about $25/1000^{th}$ of an inch, and the cuts are approximately $1/1000^{th}$ of an inch wide, have a depth of $12/1000^{th}$ of an inch, and are spaced about $5/1000^{th}$ of an inch apart. The cuts are made, for example, in the X and Y directions thereby leaving a number of 0.005 square inch flexible columns.

Other patterns are possible as will be apparent in light of this disclosure, and the dimensions of the cuts depend on factors such as the type of material from which thermal interface board 10 is made, as well the desired levels of flexibility, manufacturing complexity, and cost.

Figure 2A:
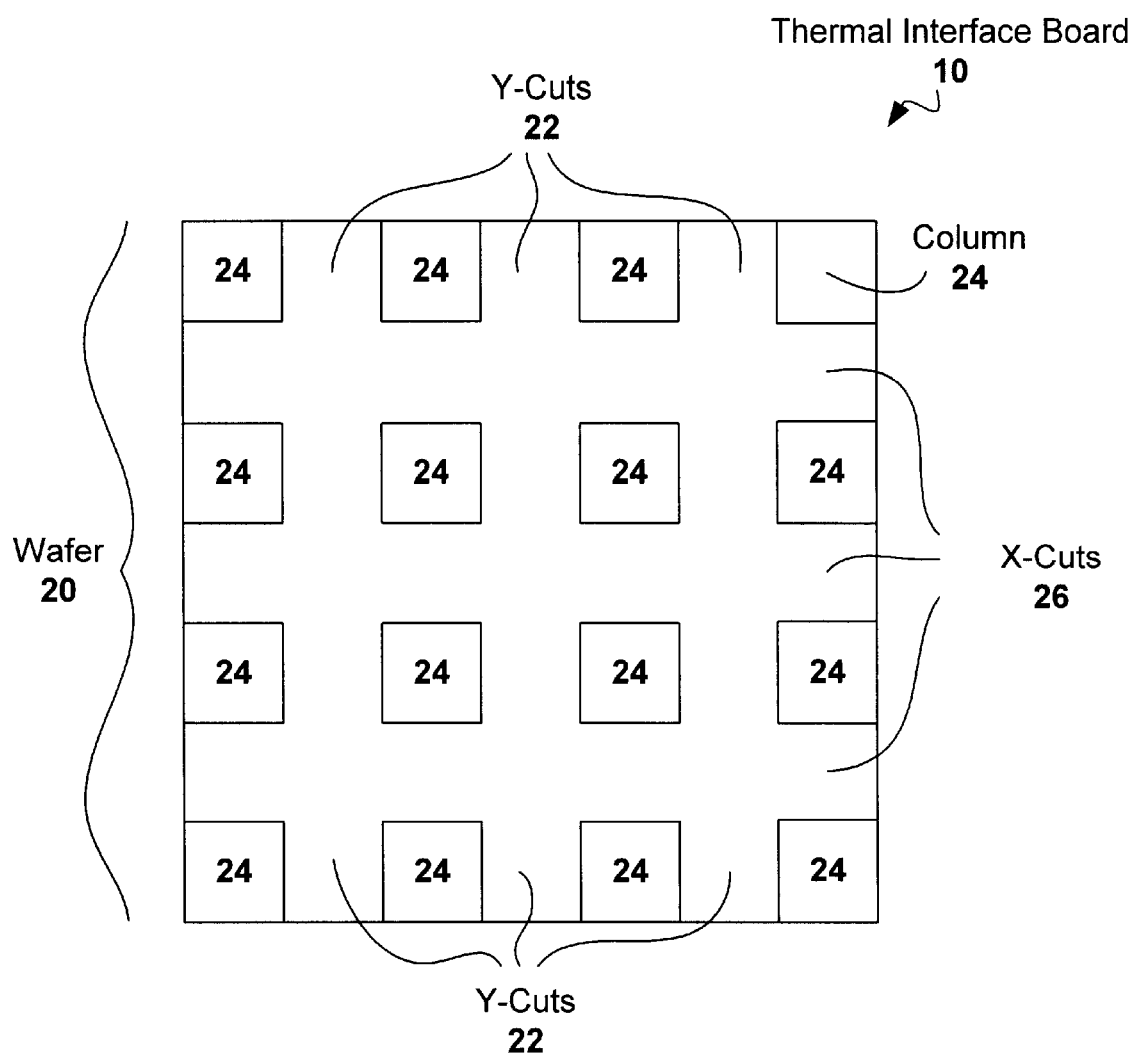
FIGS. 2a and 2b each illustrate a bottom view diagram of a thermal interface board configured in accordance with embodiments of the present invention.

FIG. 2a is a bottom view diagram illustrating a thermal interface board 10 configured in accordance with one embodiment of the present invention. As can be seen, this example thermal interface board 10 is a single wafer 20 (e.g., Silicon) with cuts running in the X and Y directions thereby defining a plurality of columns 24 in the bottom surface of wafer 20.

The Y-cuts 22 and the X-cuts 26 are made sufficiently deep and close to each other to allow each of the resulting columns to flex as previously stated. This flexible comb-like pattern or structure enables the thermal interface board 10 to compensate for the differences in thermal expansion between the cold finger 18 and the signal processing board 16.

In this embodiment, the coefficient of thermal expansion associated with the thermal interface board 10 is substantially equal to that of the processing board 16, and the underside surface of the thermal interface board 10 is configured with the flexible comb-like pattern. The flexible comb-like pattern of the surface is therefore coupled to the cold finger 18, thereby enabling compensation for differences between the coefficient of thermal expansion associated with the processing board 16 and the coefficient of thermal expansion associated with the metal surface of the cold finger 18.

In an alternative embodiment, the coefficient of thermal expansion associated with the thermal interface board 10 is substantially equal to that of the cold finger 18, and the upper surface of the thermal interface board 10 is configured with the flexible comb-like pattern. The flexible comb-like pattern will therefore be coupled with the signal processing board 16, thereby enabling compensation for differences between the coefficient of thermal expansion associated with the cold finger 18 and the coefficient of thermal expansion associated with the signal processing board 16.

In another embodiment, a flexible comb-like pattern can be implemented on both the lower and upper sides of the thermal interface board 10. In such an embodiment, the coefficient of thermal expansion of the thermal interface board 10 can match the coefficient of either the signal processing board 16 or the cold finger 18 surface. Alternatively, the coefficient of thermal expansion of the thermal interface board 10 can be somewhere between the coefficients associated with the signal processing board 16 and the cold finger 18. In any case, compensation for differences between the respective coefficients of thermal expansion is enabled.

Thus, the thermal interface board 10 has one or more surfaces patterned in accordance with the principles of the present invention, and a coefficient of thermal expansion that is equal to the coefficient of one of the surfaces being coupled, or somewhere between the coefficient of the surfaces being coupled. Such a configuration facilitates compensation for mismatched coefficients of thermal expansion.

Patterns other than those resulting from two-dimensional X-Y cuts can be realized here. For example, the two dimensional cuts can be diagonal in nature, and need not be limited to the X and Y planes to produce a flexible column structure. Alternatively, one dimensional cuts could be made in any one direction (e.g., X, Y, or diagonal) thereby defining a flexible row structure.

Alternatively, a series of circular voids having set diameters and depths can be drilled or otherwise formed in a surface or surfaces of the thermal interface board 10. The remaining material around the circular voids of the thermal interface board 10 would be afforded a certain degree of flexibility depending on the amount of material removed. Other void shapes can be used here as well, such as oval, triangular, or square voids. To add increased flexibility to such an embodiment, a number of cuts can be selectively run through the void field, the cuts being selective in that enough material is left behind to provide flexibility in conjunction with the necessary structural support.

Note that the direction of the cuts need not be limited to an orthogonal relationship with respect to the plane of the surface being cut. Rather, the cuts can be made at non-orthogonal angles (e.g., 45°) with respect to the plane of the surface being cut. Further note that the cuts need not be limited to running the length of the thermal interface board 10 surface. For instance, the cuts can have alternating lengths of 75% and 95% of the surface, where cuts starting from one edge of the surface are interlaced with cuts starting at the opposite edge.

In any such embodiments as described herein, the resulting pattern in the surface or surfaces of the thermal interface board is referred to herein as a flexible comb-like pattern.

Figure 2B:
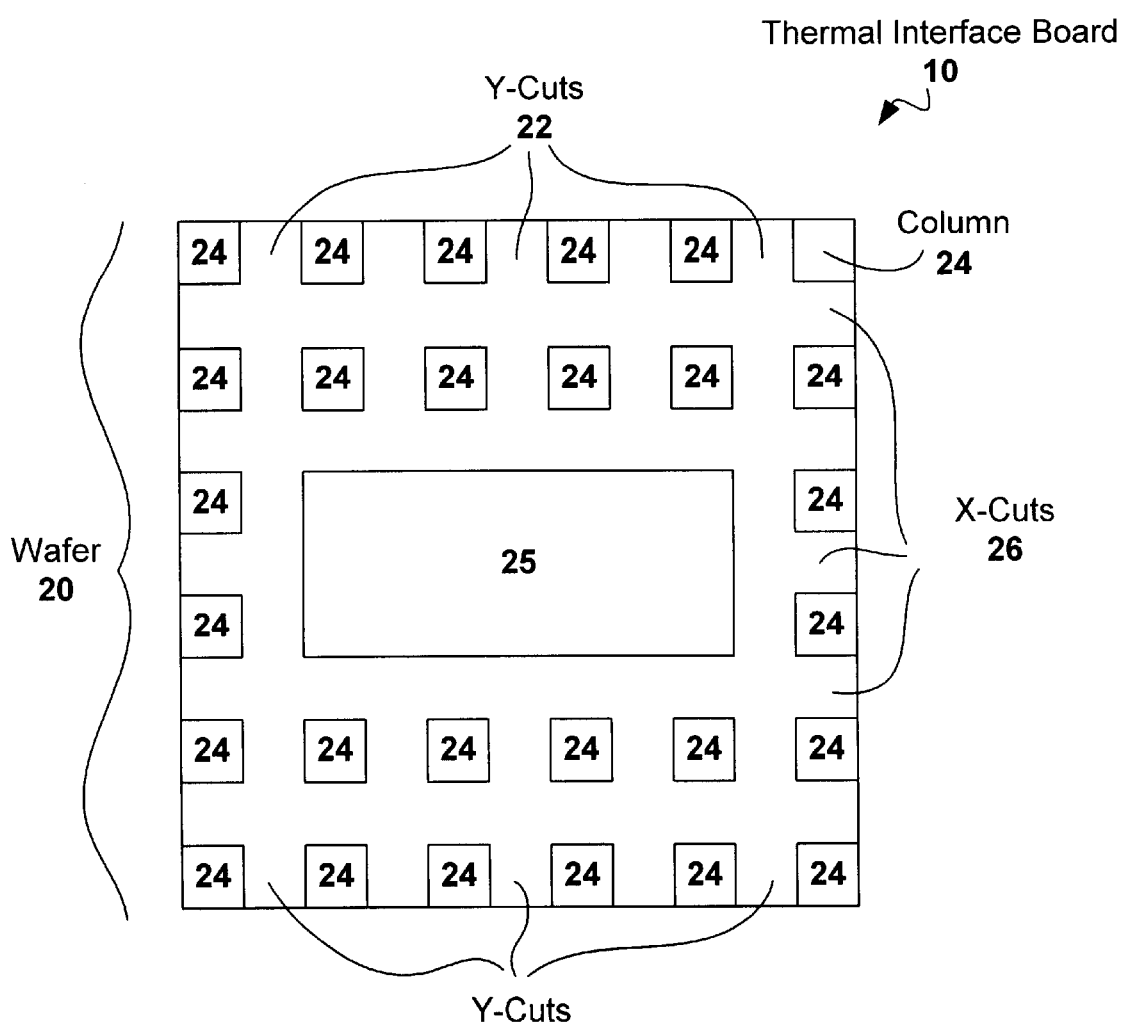

FIG. 2b is a bottom view diagram illustrating a thermal interface board 10 configured in accordance with another embodiment of the present invention. In this example, a pattern is formed on the thermal interface board 10 surface as discussed in reference to FIG. 2a. The X-cuts 26 and Y-cuts 22 are made thereby defining a number of flexible columns 24. Note, however, that the cuts do not cross the entire surface of thermal interface board 10. Rather, an island 25 is left uncut in the center portion of the surface, and the cuts are generally at the surface's perimeter. Such a pattern may be desirable in applications where most of the thermal related stressing occurs toward the perimeter of the thermal interface board 10. In addition, island 25 can be used to provide additional structural support.

Note that the relevant discussion in reference to FIG. 2a, such as the discussion on what surface or surfaces of the thermal interface board 10 can be patterned and the type of pattern, equally applies to FIG. 2b.

The patterns on the thermal interface board 10 can be formed, for example, with conventional mask and etching processes, laser technology, wafer dicing saws, or other small scale cutting technology. As previously stated, the actual form of the pattern or patterns employed will depend on factors such as the desired levels of flexibility, manufacturing complexity, and cost.

A patterned thermal interface in accordance with the principles of the present invention provides lower thermal mass than conventional techniques, thereby allowing efficient cooling of the FPA assembly. In addition, the cuts or void space in the thermal interface board 10 reduce the physical mass of the interface, as well as the number of layers or components required to produce each interface. Thus, the difficulty and failure rate associated with manufacturing such assemblies are reduced.

Figure 3:
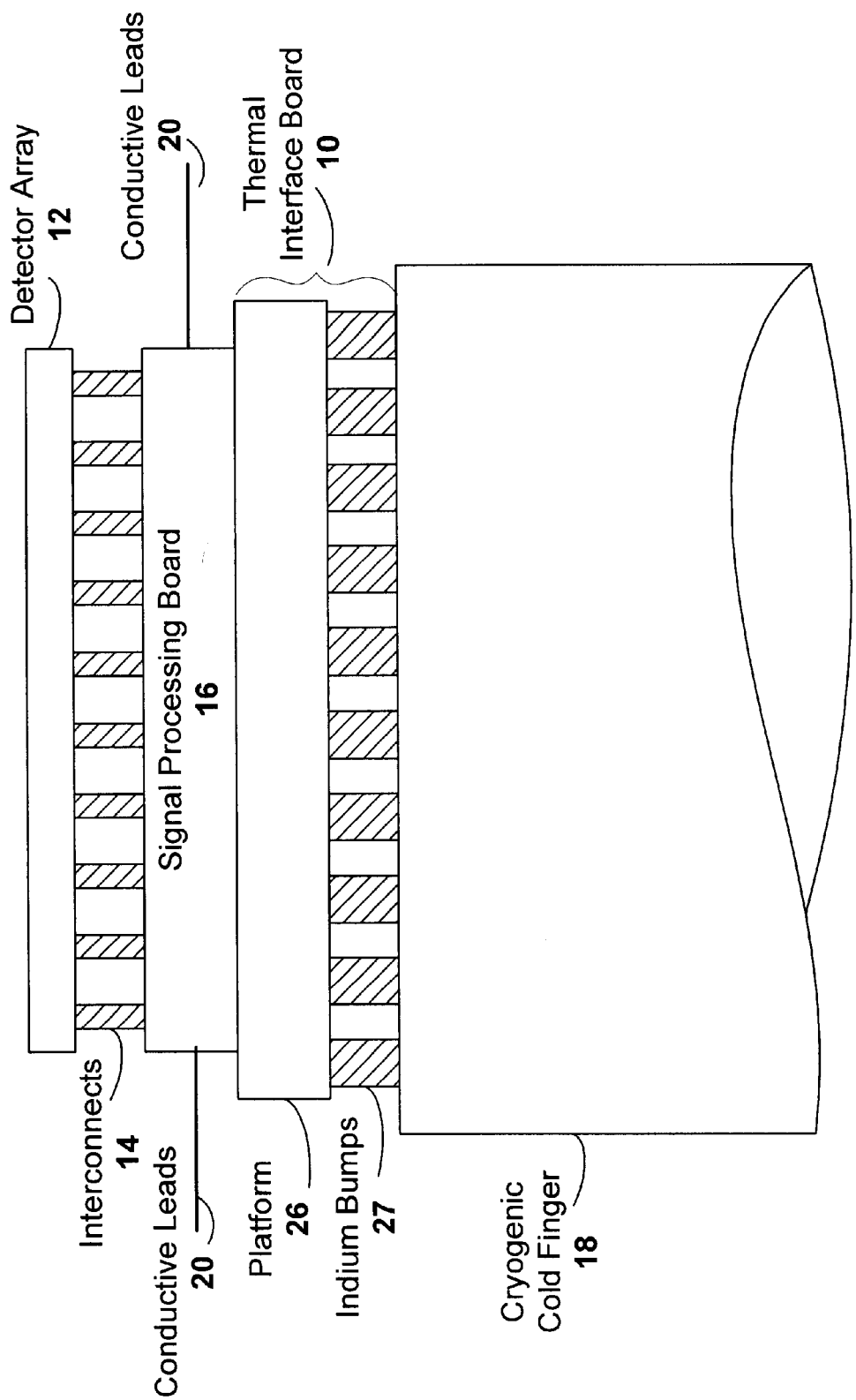
FIG. 3 is a side view diagram illustrating a focal plane array assembly configured in accordance with another embodiment of the present invention.

FIG. 3 is a side view diagram illustrating a focal plane array assembly configured in accordance with another embodiment of the present invention. The thermal interface board 10 in this embodiment includes a platform 26 and a number of flexible metal bumps on the surface of the platform 26 thereby defining a flexible comb-like pattern in the surface of the thermal interface board 10.

In one embodiment, the platform 26 is made of a material having substantially the same coefficient of thermal expansion as the signal processing board 16. For instance, assume the signal processing board 16 includes a Silicon substrate. The platfonn 26 can therefore be a single Silicon wafer. The plurality of bumps 27 are Indium bumps, or some other malleable type bonding material that does not degrade at cryogenic temperatures (or target temperature range).

In one embodiment, the bumps 27 are formed by depositing Indium bumps on both the cryogenic cold finger 18 and the platform 26. The Indium bumps on each surface are then aligned, and the platform 26 is compressed onto the cryogenic cold finger 18 with a controlled force thereby fusing the bumps together so as to form flexible columns referred to herein as bumps 27. The platform 26 is bonded (e.g., HYSOL epoxy) to the signal processing board 16.

Using Indium or Indium alloys (e.g., 52% Indium and 48% tin) for the bumps 27 provides a flexible, compliant interface between the signal processing board 16 and the cryogenic cold finger 18. Generally, the Indium bumps are highly flexible at ambient temperatures, but become harder and stronger at cryogenic temperatures. Thus, the Indium bumps yield to thermal contractions/expansions as the temperature transitions between cold and ambient thereby allowing the bonded surfaces to remain relatively stress free.

This result is in contrast to using a material such as lead-tin (PbSn) solder that has a relatively consistent degree of rigidity over the given range of temperature extremes. Surfaces bonded with material having such consistent rigidity must endure opposing contractions and expansions of one another as there is no countering-flexibility provided by the bonding agent.

Just as with the embodiment illustrated in FIG. 1, the FPA assembly of FIG. 3 can be manufactured in stages. For instance, the platform 26 can be bonded to the cold finger 18 via the Indium bumps 27 to form a first sub-assembly, while the detector array 12 can be electrically and mechanically connected to the signal processing board 16 via interconnects 14 to form a second sub-assembly. The first and second sub-assemblies can then be bonded together (e.g., epoxy or rubber cement) to form the overall assembly. In addition, the sub-assemblies can be tested for proper operation prior to forming the overall assembly.

The Indium bumps 27 can be patterned just as the flexible columns illustrated in FIGS. 2a and 2b can be patterned. For example, the Indium bumps 27 may form a uniform field of bumps evenly spaced in rows and columns. Alternatively, the bumps 27 may be spaced in an irregular pattern. In either case, the platform 26 and the cold finger 18 can be pressed together (with their individual bumps aligned) so that flexible, bonding bumps 27 are formed between the respective surfaces of the platform 26 and the cold finger 18. In this sense, bumps 27 define a flexible comb-like pattern in the surface of the thermal interface board 10.

The force at which the two are pressed together will depend on factors such as the number of connection points, the area of each bump, and the amount of Indium (whether 100% Indium or an alloy). A force in the range of Kilograms will generally cause sufficient adhesion between the platform 26 and the cold finger 18 given 100% Indium bumps. Appropriate Indium alloys generally require less force. Note that an equal or better opposing force is required to break the connection. Each bump 27 can, for example, have a diameter in the range of about $1/10000^{th}$ to $1/100^{th}$ of an inch, and a height in the range of about $1/10000^{th}$ to $2/1000^{th}$ of an inch.

The Indium bumps 27 can also be formed in a flexible comb-like pattern that is limited to the perimeter of the platform 26, where the inner portion of the platform 26 surface is connected to the cold finger 18 via a less flexible material, such as PbSn solder. Such an embodiment may provide increased structural integrity, but still provide necessary flexibility to relieve thermal-related stress.

In an alternative embodiment, the platform 26 has a coefficient of thermal expansion that is substantially equal to the cold finger 18, and the platform 26 is bonded (e.g., epoxy or rubber cement) to the cold finger 18. The bumps 27 provide flexibility between the platform 26 and the signal processing board 16.

In another embodiment, the platform 26 has a coefficient of thermal expansion that is between that of the cold finger 18 and the signal processing board 16. In one such embodiment, the coefficient associated with the platform 26 is midway between the coefficients of the cold finger 18 and the signal processing board 16, and the bumps 27 are provided on both sides of the platform 26. Flexibility is provided between both the platform 26 and the processing board 16, and between the platform 26 and the cold finger 18.

The foregoing description of the embodiments of the invention has been presented for the purposes of illustration and description. It is not intended to be exhaustive or to limit the invention to the precise form disclosed. Many modifications and variations are possible in light of this disclosure. For example, the principles described herein can be applied to any number of integrated circuit assemblies (not just FPA assemblies) that are subjected to thermal-related stress caused by a mismatch in coefficients of thermal expansion.

One such example is a processor (e.g., CPU, microprocessor, or microcontroller unit) application. Generally stated, the speed at which a processor operates can be increased when the processor is cooled. Thus, a cooled processor application can be effected in accordance with this disclosure. For instance, a thermal interface board 10 can be bonded between a high speed processor and a cold finger or other temperature changing interface. Likewise, a thermal interface board 10 can be integrated into the design of the high speed processor itself. Differences in coefficients of thermal expansion associated with the cold finger and/or the processor are accordingly neutralized thereby allowing a cooled, high speed processor application.

In addition, the present invention need not be limited to thermal-related stress caused by cycling between ambient and cryogenic temperatures. Transitioning between hot and ambient, or hot and cold temperatures may also generate thermal-related stress that can be compensated for using the principles of the present invention. Again, note that stress related to thermal expansions and/or contractions can be compensated for by employing embodiments of the present invention. It is intended that the scope of the invention be limited not by this detailed description, but rather by the claims appended hereto.

What is claimed is:

1. A focal plane array assembly comprising:
   a thermal interface board having first and second surfaces, wherein a flexible comb-like pattern adapted to compensate for a mismatch in coefficients of thermal expansion is formed in at least one of the first and second surfaces;
   a cryogenic cold finger having a metal surface associated with a first coefficient of thermal expansion, the metal surface being operatively coupled to the first surface of the thermal interface board; and
   a signal processing board associated with a second coefficient of thermal expansion and having one of its surfaces operatively coupled to the second surface of the thermal interface board.

2. The assembly of claim 1 wherein the thermal interface board is a Silicon wafer.

3. The assembly of claim 1 wherein the thermal interface board has a coefficient of thermal expansion that is substantially equal to the second coefficient of thermal expansion associated with the signal processing board, and the flexible comb-like pattern is formed in the first surface of the thermal interface board so as to compensate for differences between the second coefficient of thermal expansion and the first coefficient of thermal expansion associated with the metal surface of the cold finger.

4. The assembly of claim 1 wherein the thermal interface board has a coefficient of thermal expansion that is substantially equal to the first coefficient of thermal expansion associated with the metal surface of the cold finger, and the flexible comb-like pattern is formed in the second surface of the thermal interface board so as to compensate for differences between the first coefficient of thermal expansion and the second coefficient of thermal expansion associated with the signal processing board.

5. The assembly of claim 1 wherein the thermal interface board has a coefficient of thermal expansion that is between the first and second coefficients of thermal expansion, and the flexible comb-like pattern is formed in the first and second surfaces of the thermal interface board so as to compensate for differences between the first and second coefficients of thermal expansion.

6. The assembly of claim 1 wherein the thermal interface board is a single wafer, and the flexible comb-like pattern includes a number of cuts in a surface of the wafer.

7. The assembly of claim 1 wherein the thermal interface board includes a platform, and the flexible comb-like pattern includes a number of Indium bumps on a surface of the platform.

8. The assembly of claim 1 wherein each surface of the thermal interface board has a perimeter and a center portion, and the flexible comb-like pattern includes a number of cuts at the perimeter and an island that is uncut.

9. The assembly of claim 1 wherein the cryogenic cold finger is associated with a Dewar-type flask.

10. The assembly of claim 1 wherein the signal processing board includes a multiplexer circuit that is operatively coupled with a detector array.

11. A method of manufacturing a focal plane array assembly, the method comprising:
   forming a flexible comb-like pattern adapted to compensate for a mismatch in coefficients of thermal expansion in at least one of first and second surfaces of a thermal interface board;
   bonding the first surface of the thermal interface board to a surface of a cryogenic cold finger associated with a first coefficient of thermal expansion; and
   bonding the second surface of the thermal interface board to a signal processing board associated with a second coefficient of thermal expansion.

12. The method of claim 11 wherein the thermal interface board has a coefficient of thermal expansion that is substantially equal to the second coefficient of thermal expansion associated with the signal processing board, and the flexible comb-like pattern is formed in the first surface of the thermal interface board thereby enabling compensation for differences between the second coefficient of thermal expansion and the first coefficient of thermal expansion associated with the metal surface of the cold finger.

13. The method of claim 11 wherein the thermal interface board has a coefficient of thermal expansion that is substantially equal to the first coefficient of thermal expansion associated with the metal surface of the cold finger, and the flexible comb-like pattern is formed in the second surface of the thermal interface board thereby enabling compensation for differences between the first coefficient of thermal expansion and the second coefficient of thermal expansion associated with the signal processing board.

14. The method of claim 11 wherein the thermal interface board has a coefficient of thermal expansion that is between the first and second coefficients of thermal expansion, and the flexible comb-like pattern is formed in the first and second surfaces of the thermal interface board thereby enabling compensation for differences between the first and second coefficients of thermal expansion.

15. The method of claim 11 wherein the thermal interface board is a single wafer, and forming the flexible comb-like pattern includes providing a number of cuts in a surface of the wafer thereby defining the flexible comb-like pattern in the surface of the thermal interface board.

16. The assembly of claim 11 wherein the thermal interface board includes a platform, and forming the flexible comb-like pattern includes providing a number of Indium bumps on a surface of the platform thereby defining the flexible comb-like pattern in the surface of the thermal interface board.

17. The method of claim 11 wherein each surface of the thermal interface board has a perimeter and a center portion, and forming the flexible comb-like pattern includes providing a number of cuts at the perimeter of the thermal interface board and leaving an island in the center portion uncut.

18. An integrated circuit assembly comprising:
   a thermal interface board having first and second surfaces, wherein a flexible comb-like pattern adapted to compensate for a mismatch in coefficients of thermal expansion/contraction is formed in at least one of the first and second surfaces;
   a temperature changing interface associated with a first coefficient of thermal expansion/contraction, the temperature changing interface being operatively coupled to the first surface of the thermal interface board; and
   a signal processing board associated with a second coefficient of thermal expansion/contraction, the signal processing board being operatively coupled to the second surface of the thermal interface board.

19. The assembly of claim 18 wherein the thermal interface board is a single wafer, and the flexible comb-like pattern includes a number of cuts in a surface of the wafer.

20. The assembly of claim 18 wherein the thermal interface board includes a platform, and the flexible comb-like pattern includes a number of Indium bumps on a surface of the platform.

* * * * *